(12) United States Patent
Lim et al.

(10) Patent No.: US 7,571,424 B2
(45) Date of Patent: Aug. 4, 2009

(54) DIFFUSED AERIAL IMAGE MODEL SEMICONDUCTOR DEVICE FABRICATION

(75) Inventors: Chang Moon Lim, Seoul (KR); Jun Taek Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 24 days.

(21) Appl. No.: 11/592,142

(22) Filed: Nov. 3, 2006

(65) Prior Publication Data

US 2007/0106973 A1 May 10, 2007

(30) Foreign Application Priority Data

Nov. 7, 2005 (KR) .................. 10-2005-0106071

(51) Int. Cl.
*G06F 17/50* (2006.01)
(52) U.S. Cl. .................. 716/21; 716/19; 716/20; 703/2; 430/270.1; 430/325; 438/780
(58) Field of Classification Search ............. 716/19–21; 703/2; 430/270.1, 325; 438/780
See application file for complete search history.

(56) References Cited

U.S. PATENT DOCUMENTS

| 5,932,100 | A | * | 8/1999 | Yager et al. ............. 210/634 |
| 5,999,720 | A | | 12/1999 | Inui |
| 6,049,660 | A | * | 4/2000 | Ahn et al. ............. 703/13 |
| 6,295,637 | B1 | * | 9/2001 | Li ............. 716/21 |
| 6,689,529 | B2 | * | 2/2004 | Feke et al. ............. 430/139 |
| 6,900,001 | B2 | * | 5/2005 | Livesay et al. ............. 430/325 |
| 6,936,398 | B2 | * | 8/2005 | Fedynyshyn ............. 430/270.1 |
| 7,038,328 | B2 | * | 5/2006 | Enomoto et al. ............. 257/791 |
| 7,090,961 | B2 | * | 8/2006 | Kobayashi et al. ............. 430/270.1 |
| 7,117,475 | B2 | * | 10/2006 | Croffie ............. 716/19 |
| 7,150,949 | B2 | * | 12/2006 | Askebjer et al. ............. 430/30 |
| 7,153,630 | B2 | * | 12/2006 | Fedynyshyn ............. 430/270.1 |
| 7,266,800 | B2 | * | 9/2007 | Sezginer ............. 716/21 |
| 7,319,944 | B2 | * | 1/2008 | Nakamura et al. ............. 703/6 |
| 2005/0166172 | A1 | * | 7/2005 | Kawamura et al. ............. 716/19 |
| 2005/0175927 | A1 | * | 8/2005 | Kishioka et al. ............. 430/270.1 |
| 2006/0183039 | A1 | * | 8/2006 | Croffie ............. 430/30 |
| 2007/0038417 | A1 | * | 2/2007 | Huang et al. ............. 703/2 |
| 2007/0059946 | A1 | * | 3/2007 | Mulders ............. 438/780 |
| 2008/0226152 | A1 | * | 9/2008 | Dirksen et al. ............. 382/141 |

FOREIGN PATENT DOCUMENTS

KR 1020060001007 A 1/2006

* cited by examiner

*Primary Examiner*—Naum B Levin
(74) *Attorney, Agent, or Firm*—Townsend and Townsend and Crew LLP

(57) ABSTRACT

A lithography method has a simulation method for mathematically approximating a photoresist film pattern with a Diffused Aerial Image Model ("DAIM") for semiconductor device fabrication. The DAIM is applied with at least two acids having heterogeneous diffusion characteristics.

3 Claims, 4 Drawing Sheets

DIFFUSED AERIAL IMAGE MODEL SEMICONDUCTOR DEVICE FABRICATION

CROSS-REFERENCES TO RELATED APPLICATIONS

The present application claims priority to Korean patent application number 10-2005-0106071, filed on Nov. 07, 2005, which is incorporated by reference in its entirety.

BACKGROUND OF THE INVENTION

The present invention generally relates to a lithography process. More specifically, the present invention relates to a lithography method having a simulation method with a Diffused Aerial Image Model ("DAIM").

A simulation technology of an optical lithography process is extremely excellent in the optimization of a cell layout, prediction of optimum conditions of a complicated process or prompt processing of huge data. Thus, the simulation technology has been widely used to reduce trials and errors in unit process development and new device development to shorten a development period.

Generally, a simulation tool of a photoresist process in the lithography process comprises: 1) a tool such as SOLID-C and Prolith, which simulates the whole process including composition, exposure and baking of photoresist materials; and 2) a tool such as a simulation function in OPC, which quantifies an aerial image to obtain an approximate result. Although the first tool has more accurate calculation results than the second tool, it takes a long time and is complicated. Otherwise, the second tool is less accurate than the first tool although the second tool's calculating speed is fast. Specifically, the second tool to optimize a mask layout requires an Optical Proximity effect Correction ("OPC"). A widely used method for OPC provides considering an aerial image intensity contour as a top view of the photoresist film pattern to approximate a target layout desired by the aerial image.

Meanwhile, a chemical amplification photoresist generates an acid by a Photo Active Generator ("PAG") due to photon energy in an exposure process. When the standard concentration of the PAG is called "P" and the light intensity is called "I", the concentration change resulting from resolution of the PAG for an exposure time t satisfies $\partial P(x,y,t)/\partial t = -C(x,y)P(x,y,t)$. Here, C as a proportional constant is the same as Dill's C. The acid is generated as much as the amount of the resolved PAG. Provided that the sum total of concentrations of the PAG and the acid is constant at all times, the standard concentration distribution $A_0$ of the acid right after exposure is represented by $A_0(x,y)=1-e^{-CE(x,y)}$. If the exponent value of the exponential function is not large, the above equation $A_0$ approximately represents $A_0(x,y) \cong CE(x,y)$. As a result, the distribution of the acid is proportional to that of the intensity of the exposed light. The acid generated by the exposure process is diffused by thermal energy during a subsequent post exposure baking ("PEB") process. During the PEB process, the concentration A of the standard acid satisfies $\partial A(x,y,t')/\partial t' = -D\nabla^2 A(x,y,t')$ in accordance with the Fick's law, where t' represents a PEB time. The solution of the above differential equation as well known expresses $A(x,y,t') = F^{-1} e^{-\sigma^2(\xi^2+\eta^2)/2} F(A_0(x',y'))$ if $(\xi, \eta)$ are used as conjugation coordinates with respect to $(x, y)$ coordinates in Fourier transformation.

During the PEB process, while the acid is diffused, it attacks a chain ring of a dissolution inhibitor or a protection group in a photoresist film. As a result, the acid is separated from a base polymer so that it may be dissolved in a developing solution. Since the concentration of the polymer separated from each spatial coordinate depends on the distribution of the average acid with respect to time in each point for the PEB time $t_B$, the concentration $M(x, y)$ of the separated polymer is represented as follows:

$$M(x, y, t_B) \approx \overline{A(x, y, t)}$$

$$= \frac{\int_0^{t_B} A(x, y, t)dt}{t_B}$$

$$= \frac{2}{\sigma_B^2} F^{-1}\left[\frac{1-e^{-\sigma_B^2(\xi^2+\eta^2)/2}}{\xi^2+\eta^2} F(A_0(x', y'))\right].$$

The above-described method is very effective in simulation of the lithography process. As the pattern becomes smaller and the Rayleigh k1 constant, which shows a degree of process complexity, is decreased, the above-described method is however inconsistent with actual experimental results.

FIG. 1 is a photograph illustrating an actual pattern of a lithography process. Images of FIGS. 2a and 2b obtained by a conventional simulation method are different from the actual pattern of FIG. 1. In other words, the connected image in the dotted circle of FIGS. 2a and 2b is different from the simulation result in the actual disconnected pattern. FIG. 2a shows when the diffusion constant is 0 while FIG. 2b shows when the diffusion constant is 0.375.

In the above-described conventional simulation method of the lithography process, simulation errors are generated as the process becomes more difficult. Accordingly, the simulation results are not reliable.

BRIEF SUMMARY OF THE INVENTION

Embodiments of the present invention are directed to the lithography process having a simulation method with improved DAIM. According to one embodiment, the improved DAIM is applied with the diffusion characteristic of at least two acids having heterogeneous diffusion characteristics in simulation.

In one embodiment of the present invention, a lithography process has a simulation method for mathematically approximating a photoresist film pattern with a diffused aerial image model ("DAIM"), wherein heterogeneous diffusion characteristics are applied to the DAIM.

DESCRIPTION OF SPECIFIC EMBODIMENTS

Figure 1:
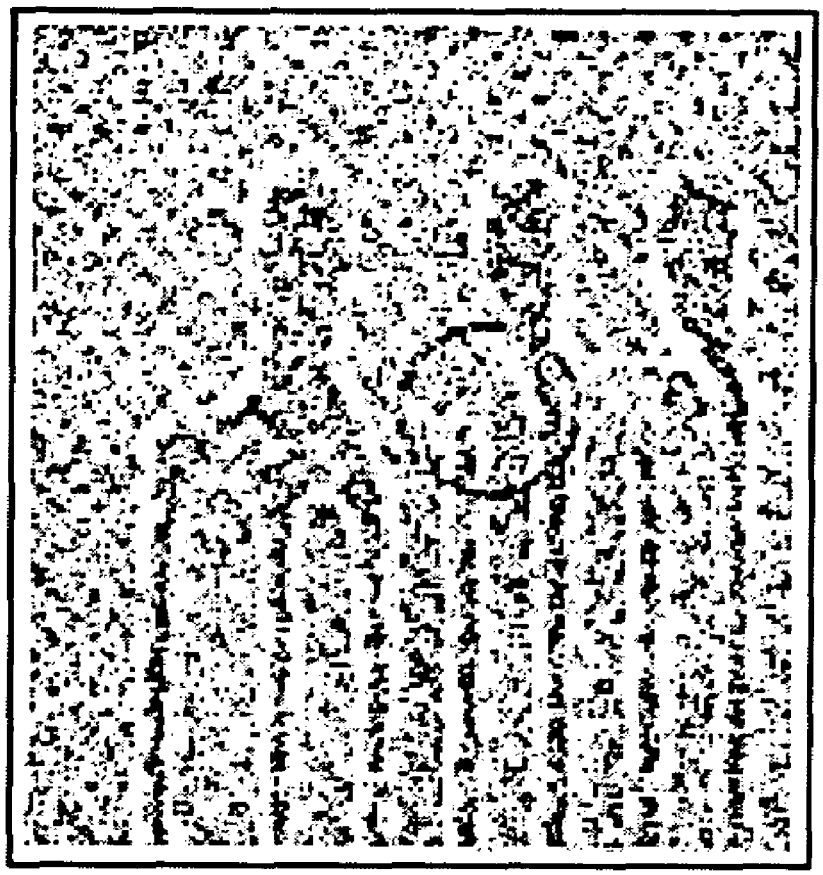
FIG. 1 is a photograph illustrating an actual photoresist film pattern according to an lithography process.
Figure 2A:
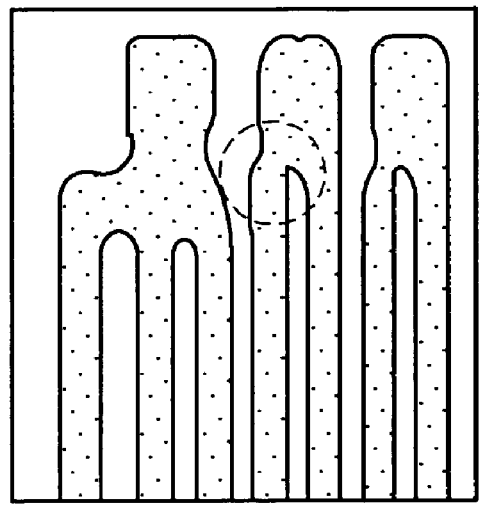
FIGS. 2a and 2b are diagrams illustrating a conventional simulation result.
Figure 2B:
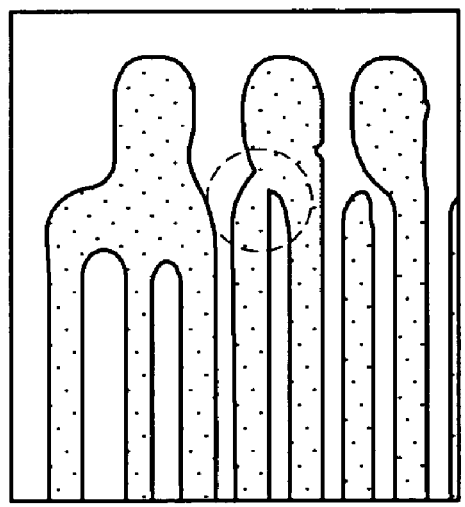

The present invention relates to lithography methods having a simulation method with improved DAIM. The improved DAIM is applied with a diffusion characteristic of at least two acids having heterogeneous diffusion characteristics in simulation. Accordingly, the improved DAIM provides minimized difference between an actual image and a simulation image.

According to an embodiment of the present invention, a photoresist film pattern is modeled with at least two acids having heterogeneous diffusion characteristics. If the acids included in a photoresist are $A_1$ and $A_2$ having two heterogeneous diffusion characteristics, each diffusion of $A_1$ and $A_2$ is represented as follows:

$$\frac{\partial A_1(x, y, t)}{\partial t} = D_1 \nabla^2 A_1(x, y, t)$$

and $$\frac{\partial A_2(x, y, t)}{\partial t} = D_2 \nabla^2 A_2(x, y, t),$$

where $D_1$ and $D_2$ are diffusion constants of each acid.

The solutions for the above equations are obtained by the same way as the prior art. The solutions are represented as follows:

$$A_1(x,y,t) = F^{-1}(e^{-\sigma_1^2(\xi^2+\eta^2)/2} F(A_{10}(x',y'))) \text{ and}$$

$$A_2(x,y,t) = F^{-1}(e^{-\sigma_2^2(\xi^2+\eta^2)/2} F(A_{20}(x',y'))).$$

The total concentration of acids included in the photoresist may be represented by the sum total of concentrations of each acid. That is, if the initial distributions of two acids are $A_{10}$ and $A_{20}$ and the one concentration fraction of the acids is f, the distribution of the acids based on that of the light intensity is represented as follows:

$$A(x, y, t) = A_1(x, y, t) + A_2(x, y, t)$$
$$= F^{-1}((f e^{-\sigma_1^2(\xi^2+\eta^2)/2} + (1-f)e^{-\sigma_2^2(\xi^2+\eta^2)/2})$$
$$F(A_0(x', y'))).$$

In accordance with the above equation, the concentration $M(x,y,t_B)$ of an unprotected polymer included in the photoresist depends on the average concentration distribution of the acid with respect to time, which is represented as follows:

$$M(x, y, t_B) \approx \overline{A(x, y, t)}$$

$$= \frac{1}{t_B} \int_0^B A(x, y, t) dt$$

$$= F^{-1}\left( \left( \frac{2f}{\sigma_1^2} \frac{1-e^{-\sigma_1^2(\xi^2+\eta^2)/2}}{\xi^2+\eta^2} + \frac{2(1-f)}{\sigma_2^2} \frac{1-e^{-\sigma_2^2(\xi^2+\eta^2)/2}}{\xi^2+\eta^2} \right) F(A_0(x', y')) \right),$$

where $\sigma_1$ and $\sigma_2$ are diffusion coefficients of two acids having heterogeneous diffusion characteristics, f is one concentration fraction (0<f<1), (x, y) are plane coordinates where a photoresist exists, and ($\xi$, $\eta$) are spatial frequency conjugation coordinates with respect to (x, y) in Fourier transformation.

That is, while a conventional DAIM approximates a photoresist film pattern through a lithography process in consideration of the acid having a homogenous diffusion characteristic, the DAIM according to one embodiment of the present invention simulates the photoresist film pattern with the diffusion coefficients $\sigma_1$ and $\sigma_2$ of two acids having heterogeneous diffusion characteristics and the concentration fraction f as parameters. Here, the diffusion coefficient $\sigma$ is $\sqrt{2Dt}$ and, the time $t_B$ is a Baking time.

Preferably, the lithography method according to one embodiment of the present invention further includes applying a threshold value model to the DAIM in order to predict a photoresist film pattern. That is, the diffusion coefficients $\sigma_1$ and $\sigma_2$, and concentration fraction f of the DAIM are determined by fitting them to actual experiment results. As a result, a subsequent photoresist film pattern is predicted using a Contour map with the fitted parameters.

Figure 3:
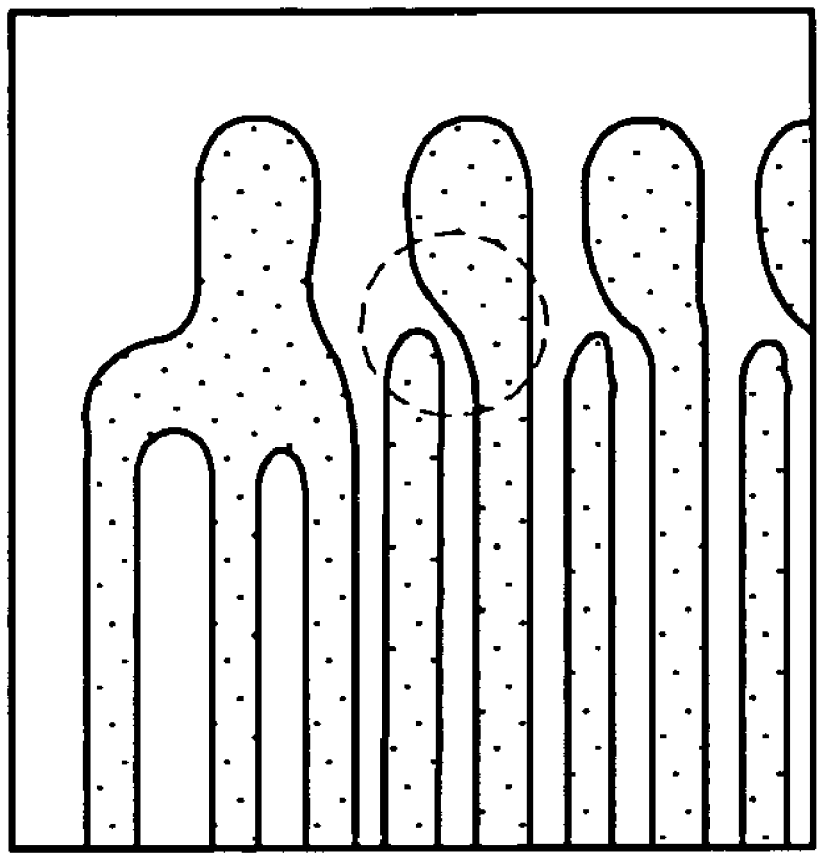
FIG. 3 is a diagram illustrating a simulation result according to an embodiment of the present invention.

FIG. 3 is a diagram illustrating a simulation result of the actual photoresist film pattern of FIG. 1. Here, $D_1$ is 0.3, $D_2$ is 0.4, and f is 0.8. As a result, the substantially same simulation result as the actual photoresist film pattern is shown.

Figure 4:
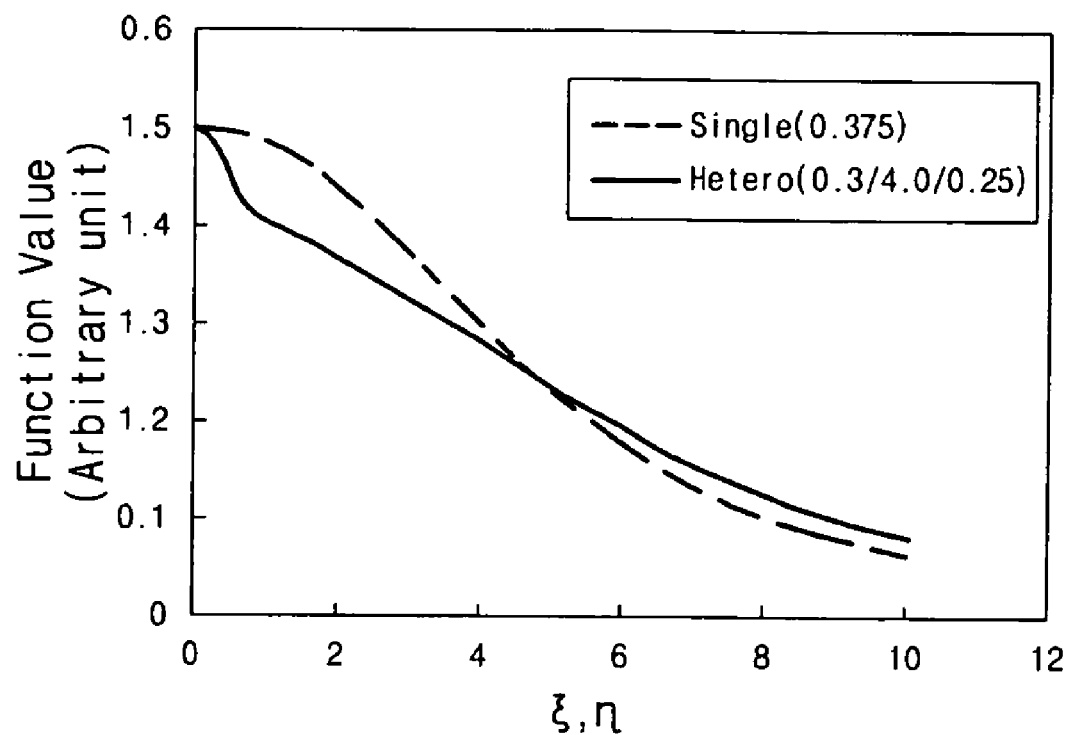
FIG. 4 is a comparative diagram of the simulation results according to the prior art and the present invention.

FIG. 4 illustrates a difference between the prior art using a single diffusion characteristic and the diffusion kernel of the present invention using heterogeneous diffusion characteristics. Here, while the diffusion constant D of the prior art is 0.375, the diffusion constants D1 and D2 are 0.3 and 0.4, and the concentration fraction f is 0.8 in the present invention.

As described above, a lithography method according to an embodiment of the present invention provides an improved simulation method. The improved simulation method facilitates accurate prediction of experimental results. Accordingly, the lithography method according to the present invention provides decreasing the number of experiments, reducing a development period and cost of semiconductor devices, and improving the OPC accuracy.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A computer-implemented lithography method comprising:
    a simulation method for mathematically approximating a photoresist film pattern with a diffused aerial image model ("DAIM"), wherein at least two acids having heterogeneous diffusion characteristics are applied to the DAIM,
    wherein at least two kinds of photo acid generator having heterogeneous diffusion characteristics are modeled to improve a simulation accuracy; and
    fabricating a semiconductor device using the photoresist film pattern,
    wherein a separated polymer of the DAIM has a concentration $M(x, y, t_B)$ obtained by the following equation:

$$M(x, y, t_B) \approx F^{-1}\left( \left( \frac{2f}{\sigma_1^2} \frac{1-e^{-\sigma_1^2(\xi^2+\eta^2)/2}}{\xi^2+\eta^2} + \frac{2(1-f)}{\sigma_2^2} \frac{1-e^{-\sigma_2^2(\xi^2+\eta^2)/2}}{\xi^2+\eta^2} \right) F(A_0(x', y')) \right)$$

where $\sigma_1$ and $\sigma_2$ are diffusion coefficients, f is a concentration fraction (0<f<1), (x, y) are plane coordinates where a photoresist exists, ($\zeta$, $\eta$) are spatial frequency conjugation coordinates with respect to (x, y) in Fourier transformation, $t_B$ is a time of a post exposure baking process, and $A_0$ is a concentration of standard acid after exposure.

2. The lithography method according to claim 1, further comprising applying a threshold value model to the DAIM to predict a photoresist film pattern.

3. The lithography method according to claim 1, wherein the diffusion coefficients $\sigma_1$ and $\sigma_2$, and the concentration fraction f are determined by fitting the diffusion coefficients $\sigma_1$ and $\sigma_2$, and the concentration fraction f to actual experiment results.

* * * * *